US011897386B2

(12) United States Patent
Tobie et al.

(10) Patent No.: US 11,897,386 B2
(45) Date of Patent: Feb. 13, 2024

(54) LIGHTED APPLIQUE FOR MOUNTING TO AN AUTOMOTIVE BODY PANEL

(71) Applicants: Rollin Anthony Tobie, Port Orange, FL (US); Lacey Jean Tobie, Port Orange, FL (US)

(72) Inventors: Rollin Anthony Tobie, Port Orange, FL (US); Lacey Jean Tobie, Port Orange, FL (US)

(*) Notice: Subject to any disclaimer, the term of this patent is extended or adjusted under 35 U.S.C. 154(b) by 0 days.

(21) Appl. No.: 17/884,655

(22) Filed: Aug. 10, 2022

(65) Prior Publication Data

US 2023/0097614 A1 Mar. 30, 2023

Related U.S. Application Data

(60) Provisional application No. 63/261,685, filed on Sep. 27, 2021.

(51) Int. Cl.
*B60Q 1/26* (2006.01)
*B60Q 1/30* (2006.01)
*F21S 43/14* (2018.01)

(52) U.S. Cl.
CPC ............ *B60Q 1/2696* (2013.01); *B60Q 1/30* (2013.01); *F21S 43/14* (2018.01)

(58) Field of Classification Search
CPC .......... B60Q 1/2696; B60Q 1/30; F21S 43/14
See application file for complete search history.

(56) References Cited

U.S. PATENT DOCUMENTS

| 8,500,310 | B2* | 8/2013 | Sakamoto | G09F 7/00 362/330 |
| 9,393,900 | B2* | 7/2016 | Held | B60Q 1/325 |
| 9,542,869 | B2* | 1/2017 | Chang | G09F 13/0409 |
| 11,560,085 | B2* | 1/2023 | Weber | B60Q 1/0035 |
| 2002/0131261 | A1* | 9/2002 | Inui | G02B 6/006 362/612 |
| 2005/0024869 | A1* | 2/2005 | Chen | G09F 13/04 362/249.14 |
| 2005/0028413 | A1* | 2/2005 | Packer | G09F 13/0409 40/551 |
| 2005/0128757 | A1* | 6/2005 | Schneider | G09F 21/04 362/398 |
| 2006/0126352 | A1* | 6/2006 | Kwon | B60Q 1/50 362/540 |
| 2008/0170405 | A1* | 7/2008 | Kamiya | B60Q 1/325 362/495 |

* cited by examiner

*Primary Examiner* — Bryon T Gyllstrom
(74) *Attorney, Agent, or Firm* — Ballard Spahr LLP

(57) ABSTRACT

A lighted applique for a vehicle body panel including an opaque body panel applique and one or more display element cutouts each having a cutout profile formed in the opaque body panel applique. At least one non-opaque display element is mounted within the one or more display element cutouts such that a panel engagement surface is in contact with a panel exterior surface. At least one LED strip is mounted within the at least one LED strip channel and an electrical connection assembly is in communication with the at least one LED strip.

19 Claims, 8 Drawing Sheets

LIGHTED APPLIQUE FOR MOUNTING TO AN AUTOMOTIVE BODY PANEL

CROSS REFERENCE TO RELATED APPLICATIONS

This application is based upon and claims benefit of priority to U.S. Provisional Application No. 63/261,685, filed Sep. 27, 2021, which application is hereby incorporated by reference herein.

FIELD OF THE INVENTION

The present invention relates to vehicular accessories and, more particularly, a vehicular body panel, molding, appliqué, tailgate, fender, or door with integrated one or more light fixtures providing lighting and/or vehicular directional safety features.

BACKGROUND

Currently, the common way of achieving higher visibility to other vehicles is the installation of a tailgate light bar. Due to the limited placement and width, the light bars are minimally effective when viewed from certain angles.

Truck taillights are vertical instead of horizontal, making them thinner and harder to spot. Nighttime and inclement weather decrease visibility of trucks on and off the road, resulting in near accidents or automotive collisions. Because typical light bars are normally installed on the gap between the tailgate and the rear bumper, their visibility is similarly limited from certain viewing angles. In sum, taller vehicles approaching a truck with a tailgate light bar will have their sight line blocked by the bottom edge of the tailgate. Shorter vehicles will have their sight line blocked by the top edge of the rear bumper.

Therefore, there is a need for a vehicular body panel, molding, appliqué, tailgate, fender, or door with integrated one or more light fixtures providing lighting and/or vehicular directional safety features.

The present disclosure eliminates the awkward tailgate gap installation, while increasing visibility to all approaching vehicles regardless of the approaching vehicle's height or angle. Specifically, the design increases vehicle visibility and safety features through a lighting system designed to increase visibility of daytime running lights (or D.R.L.s), brake lights, hazards, turn signals and reverse lights, drastically improving nearby drivers' ability to see a vehicle equipped with the present invention.

SUMMARY

The invention concerns a lighted applique for mounting to an automotive body panel having an automotive body panel contour and in proximity to an automotive safety light system. In one example embodiment the lighted applique comprises an opaque body panel applique including a panel exterior surface and a panel interior surface. The panel interior surface has an interior surface outer perimeter configured to conform to the automotive body panel contour. One or more display element cutouts each have a cutout profile formed in the opaque body panel applique. At least one non-opaque display element has a display element outer surface, a panel engagement surface, a display element rear extension comprising an exterior surface profile matching the cutout profile, and a display element rear surface forming at least one LED strip channel. The at least one non-opaque display element is mounted within the one or more display element cutouts such that the panel engagement surface is in contact with the panel exterior surface and the at least one display element rear extension extends past the panel interior surface. At least one LED strip is mounted within the at least one LED strip channel, and an electrical connection assembly is in communication with the at least one LED strip.

In an example embodiment, activation of the LED strip illuminates the non-opaque display element.

An example embodiment may further comprises one or more securing channels formed in the display element rear extension; and one or more display element securing pins. The one or more display elements are positioned in the one or more securing channels when the one or more display elements are positioned in the one or more display element cutouts to secure the one or more display elements on the opaque body panel applique.

By way of example, the at least one LED channel comprises a first LED strip channel and a second LED strip channel parallel to the first LED strip channel.

Further by way of example, the lighted applique may comprise an LED controller, wherein the at least one LED strip comprises a strip of Individually addressable LEDs.

In an example embodiment the electrical connection assembly may further comprise an automotive taillight lighting adapter configured to connect to the automotive safety lighting system.

In a specific example, the at least one non-opaque display element may comprise a recessed inner profile an opaque display insert mounted within the recessed inner profile.

In an example embodiment the panel exterior surface is shaped to simulate the automotive body panel contour.

By way of example, the interior surface outer perimeter includes an adhesive to affix the interior surface outer perimeter to the automotive body panel.

The invention further encompasses a lighted applique for mounting to an automotive body panel having an automotive body panel contour and in proximity to an automotive safety light system. In this example embodiment the lighted applique comprises an opaque body panel applique including a panel exterior surface and a panel interior surface. The panel interior surface has an interior surface outer perimeter configured to conform to the automotive body panel contour. Each of a plurality display element cutouts have a cutout profile formed in the opaque body panel applique. A plurality of non-opaque display element have a display element outer surface, a panel engagement surface, a display element rear extension comprising an exterior surface profile matching the cutout profile, and a display element rear surface. The at least one non-opaque display element is mounted within the one or more display element cutouts such that the panel engagement surface is in contact with the panel exterior surface and the at least one display element rear extension extends past the panel interior surface. At least one lighting element is mounted behind the display element rear surface. An electrical connection assembly is in communication with the at least one LED strip. The electrical connection assembly is configured to provide communication between the at least one lighting element and the automotive safety light system.

An example embodiment may further comprise at least one channel formed on one of the panel interior surface and the display element rear surface. The at least one lighting element may be mounted within the at least one channel By way of example, the at least one channel comprises a plurality of channels formed on the display element rear surface. In an example embodiment, at least one lighting element may comprise a plurality of individually addressable lighting elements and a lighting controller in communication with the plurality of individual addressable lighting elements.

In an example embodiment the at least one non-opaque display element comprises a recessed inner profile and an opaque display insert mounted within the recessed inner profile.

The invention further encompasses a method of modifying the appearance of an automotive body panel having an automotive body panel contour and in proximity to an automotive safety light system. In an example embodiment the method comprises the steps of:
assembling a lighted applique for mounting to an automotive body panel, the assembling comprising:
forming an opaque body panel applique including a panel exterior surface and a panel interior surface, the panel interior surface having an interior surface outer perimeter configured to conform to the automotive body panel contour;
forming one or more display element cutouts each having a cutout profile in the opaque body panel applique;
inserting at least one non-opaque display element into the one or more display element cutouts, the at least one non-opaque display element having a display element outer surface, a panel engagement surface, a display element rear extension comprising an exterior surface profile matching the cutout profile, and a display element rear surface forming at least one LED strip channel, the at least one non-opaque display element inserted within the one or more display element cutouts such that the panel engagement surface is in contact with the panel exterior surface and the at least one display element rear extension extends past the panel interior surface; attaching at least one LED strip mounted within the at least one LED strip channel; and mounting an electrical connection assembly in communication with the at least one LED strip.

A further example method comprises:
drilling at least one access hole in the automotive body panel;
routing the at least one electrical connection assembly through the at least one access hole; and
connecting the at least one electrical connection assembly to the automotive safety light system.

By way of example the method may further comprise:
inserting an opaque display insert mounted within a recessed inner profile formed in the at least one non-opaque display element as well as forming the panel exterior surface in a shape to simulate the automotive body panel contour.

Additionally, an example method may further comprise forming one or more securing channels in the display element rear extension, inserting one or more display element securing pins into the one or more securing channels after inserting the least one non-opaque display element into the one or more display element cutouts to secure the at least one non-opaque display element within the one or more display element cutouts and attaching a lighting controller in between the at least one LED strip and the electrical connection assembly.

DETAILED DESCRIPTION

The present disclosure can be understood more readily by reference to the following detailed description, examples, drawings, and claims, and their previous and following description. However, before the present devices, systems, and/or methods are disclosed and described, it is to be understood that this invention is not limited to the specific devices, systems, and/or methods disclosed unless otherwise specified, as such can, of course, vary. It is also to be understood that the terminology used herein is for the purpose of describing particular aspects only and is not intended to be limiting.

The following description of the invention is provided as an enabling teaching of the invention in its best, currently known embodiment. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

Figure 1:
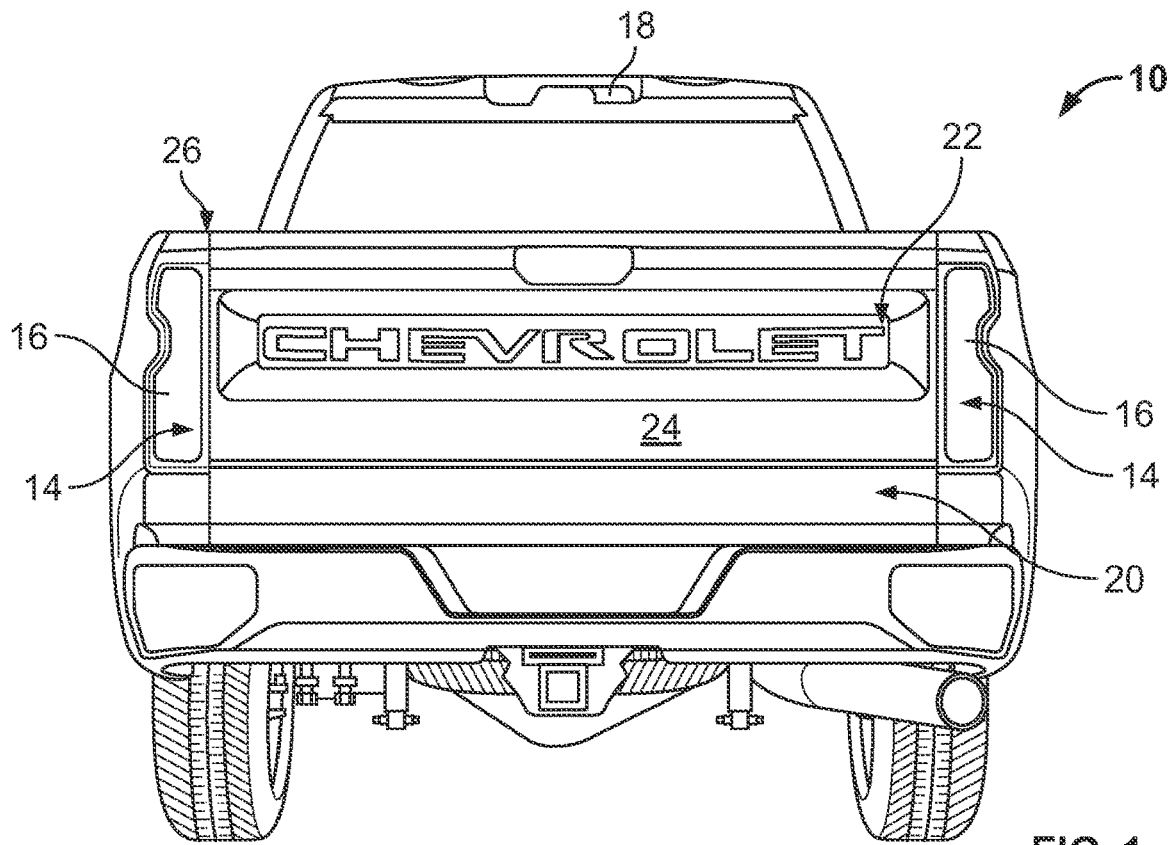
FIG. 1 is an illustration of a prior art vehicle having a liftgate/tailgate.
Figure 2:
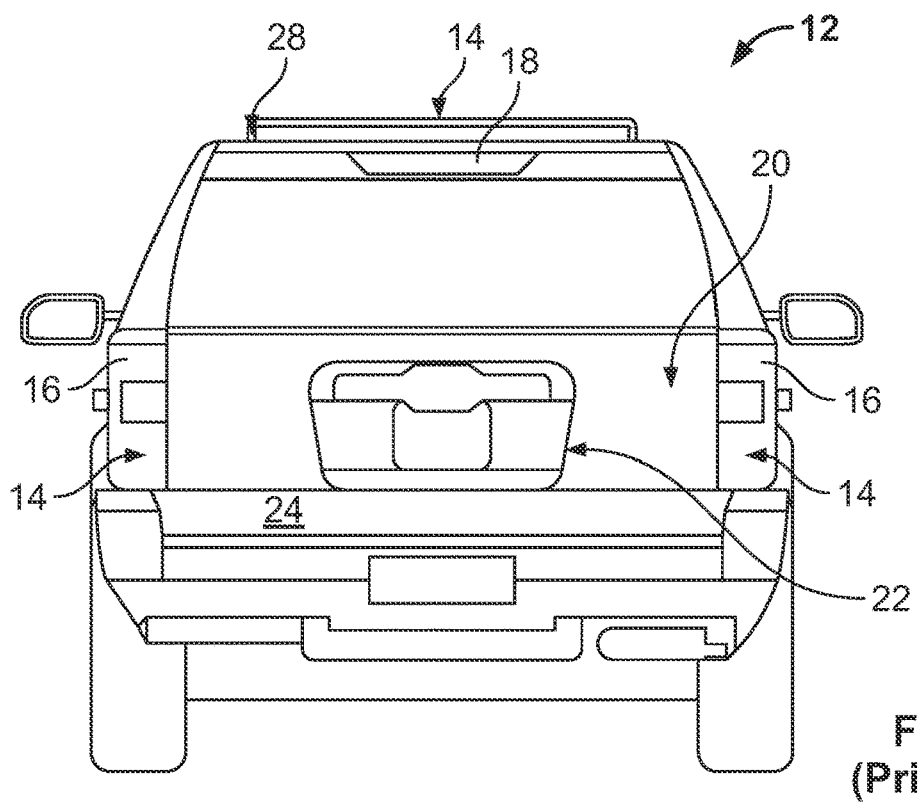
FIG. 2 is an alternate illustration of a prior art vehicle having a liftgate/tailgate.

FIGS. 1-2 show exemplary prior art automobiles with an example of pickup truck 10 being presented in FIG. 1 and a hatchback SUV 12 shown in FIG. 2. These systems commonly are manufactured with automotive safety light systems 14 including, but not limited to, turn signal, brake and rear lighting elements 16 as well as additional braking light overheads 18. The automobiles 10,12 are formed from a variety of automotive body panels 20 having unique automotive body panel contours 22. In the present examples, one of the automotive body panels 20 comprises a tailgate/liftgate 24. For the purposes of this disclosure these terms will be used interchangeably. When the bed 26 of the pickup truck 10 is transporting large items the braking light overheads 18 may be obscured by the large items and following drivers may need to rely on the corner lights 14 to indicate braking. Similarly, when large items are attached to the roof 28 of the SUV 12 for transport, the braking light overhead 18 may similarly be obscured. It would therefore be desirable to have an improved automotive safety lighting system that could operate in conditions wherein the braking light overheads 18 may be ineffective.

Figure 3:
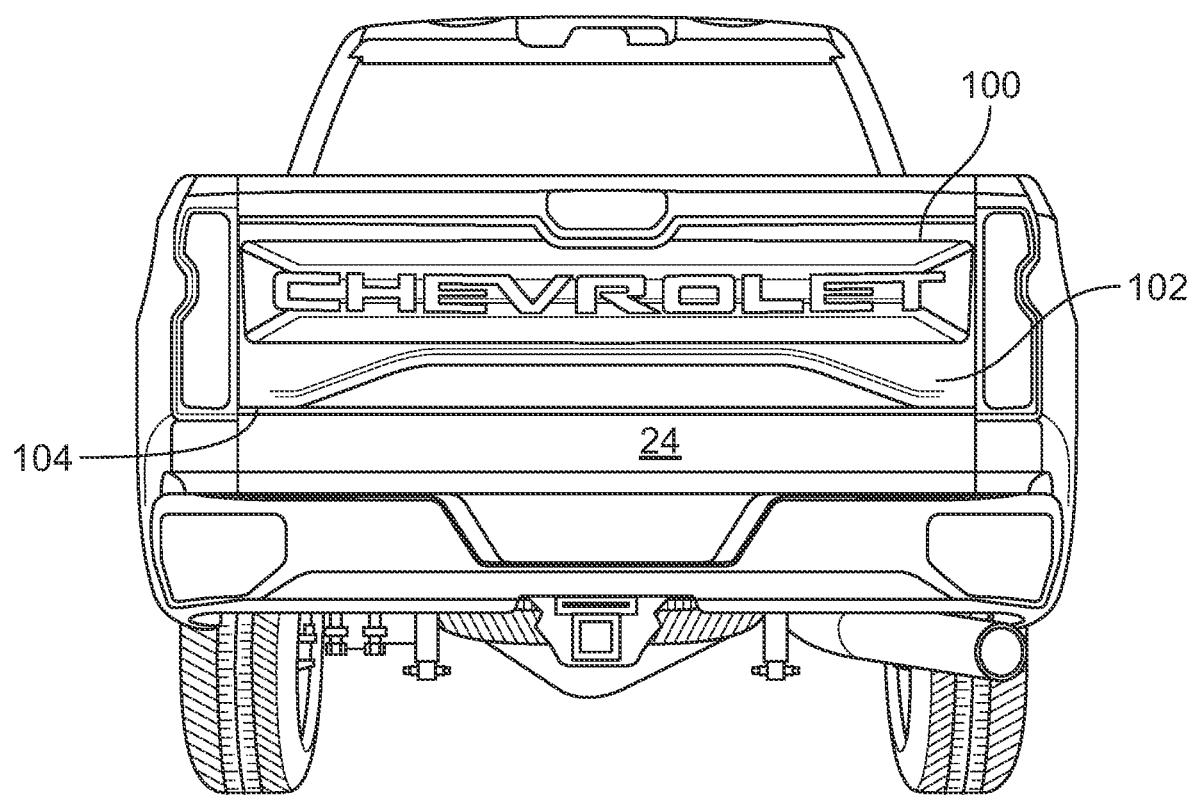
FIG. 3 is an illustration of a lighted applique in accordance with the present disclosure, the lighted applique illustrated mounted on a liftgate/tailgate of a vehicle.
Figure 4:
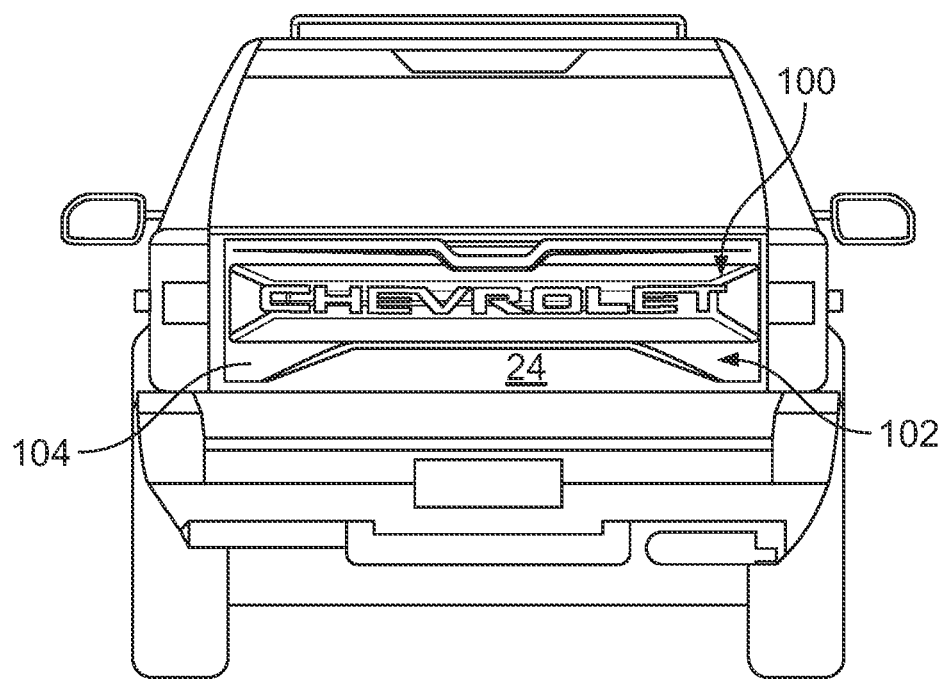
FIG. 4 is an alternate illustration of a lighted applique in accordance with the present disclosure, the lighted applique illustrated mounted on a liftgate/tailgate of a vehicle.
Figure 8:
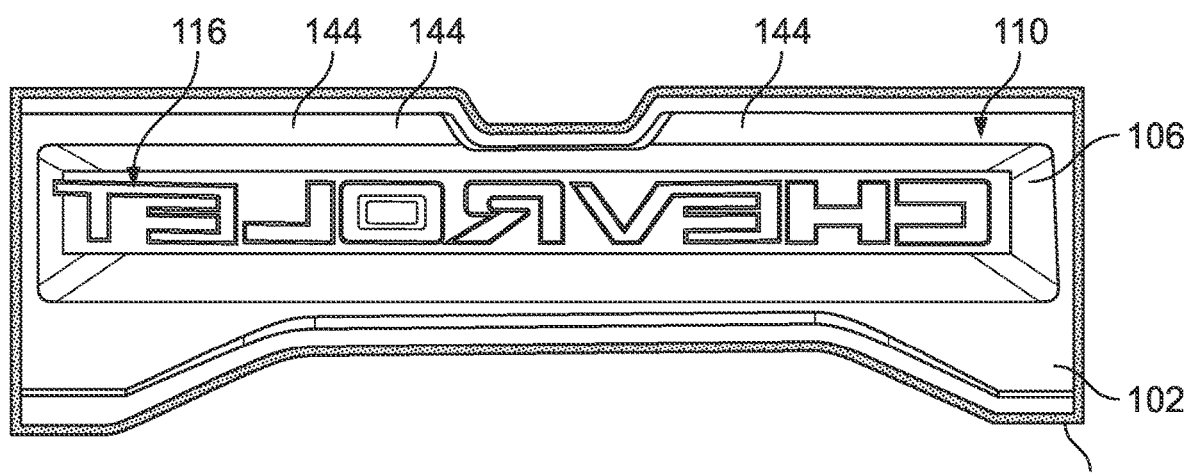
FIG. 8 is a rear face of the lighted applique shown in FIG. 7.
Figure 9:
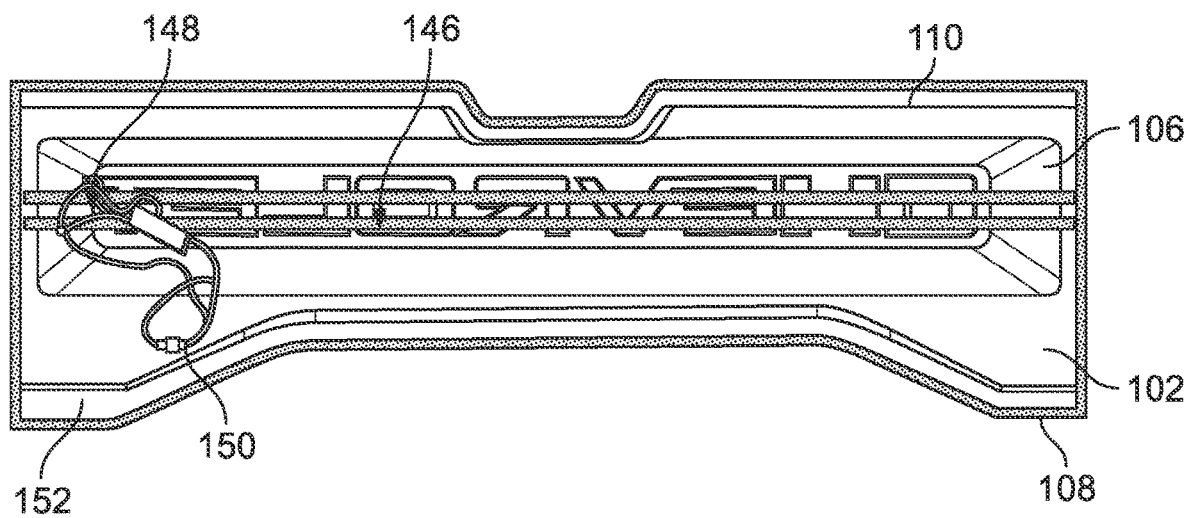
FIG. 9 is a rear face of the lighted applique shown in FIGS. 6 and 7, the applique showing the installed lighting strips.

Referring now to FIGS. 3 and 4 which disclose a lighted applique 100 in one aspect of the present disclosure for mounting to an automotive body panel 20 having an automotive body panel contour 22 and in proximity to an automotive safety light system 14. In at least one example, the automotive body panel is a liftgate/tailgate 24. The lighted applique 100 includes an opaque body panel applique 102 having a panel exterior surface 104 and a panel interior surface 106 (see FIGS. 5, 6 and 8). In one aspect of the disclosure, the opaque body panel applique 102 may be injection molded. In another aspect, it could be pressed or stamped. In still another aspect it could be 3D printed. Further, the opaque body panel applique 102 may be formed from a variety of material. In one aspect, it is contemplated that the opaque body panel applique 102 be made of a light weight material such as plastic to allow for removable engagement with the automotive body panel 20 by not requiring permanent heavy mounting features. In another aspect of the disclosure, it is contemplated that the panel interior surface 106 is configured to conform to the automotive body panel contour 22 for which it is intended to by mounted on. This allows the lighted applique to be mounted flush with the automotive body panel contour 22 and appear seamless when installed. In another aspect, the panel exterior surface 104 may be configured to simulate or closely match the automotive body panel contour 22. This allows the mounting of the lighted applique 100 to the automotive body panel 20 without changing the appearance of the automobile 10,12. The opaque body panel applique 102 further defines an interior surface outer perimeter 108 (see FIG. 8). An adhesive 110 may be positioned around the interior surface outer perimeter 108 to secure the opaque body panel applique 102 to the automotive body panel 20.

Figure 5:
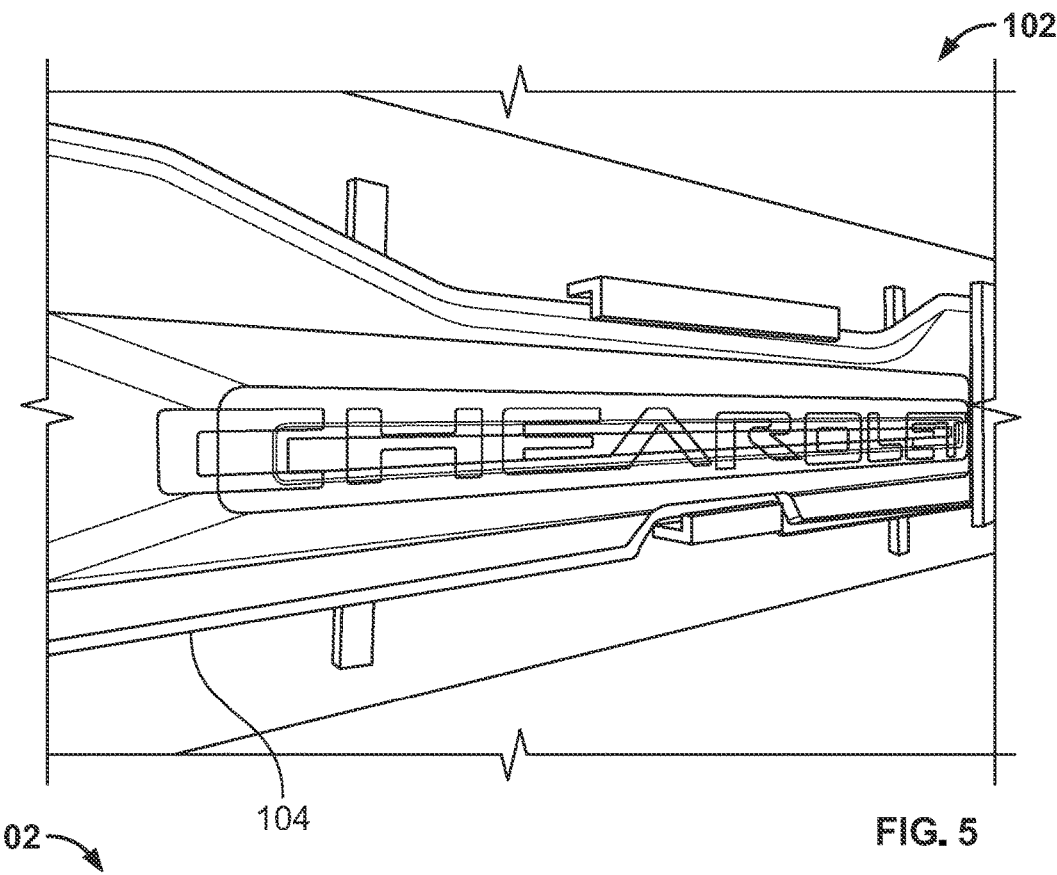
FIG. 5 is an illustration of an opaque body panel applique for use with the lighted applique in either FIG. 4 or FIG. 5.
Figure 6:
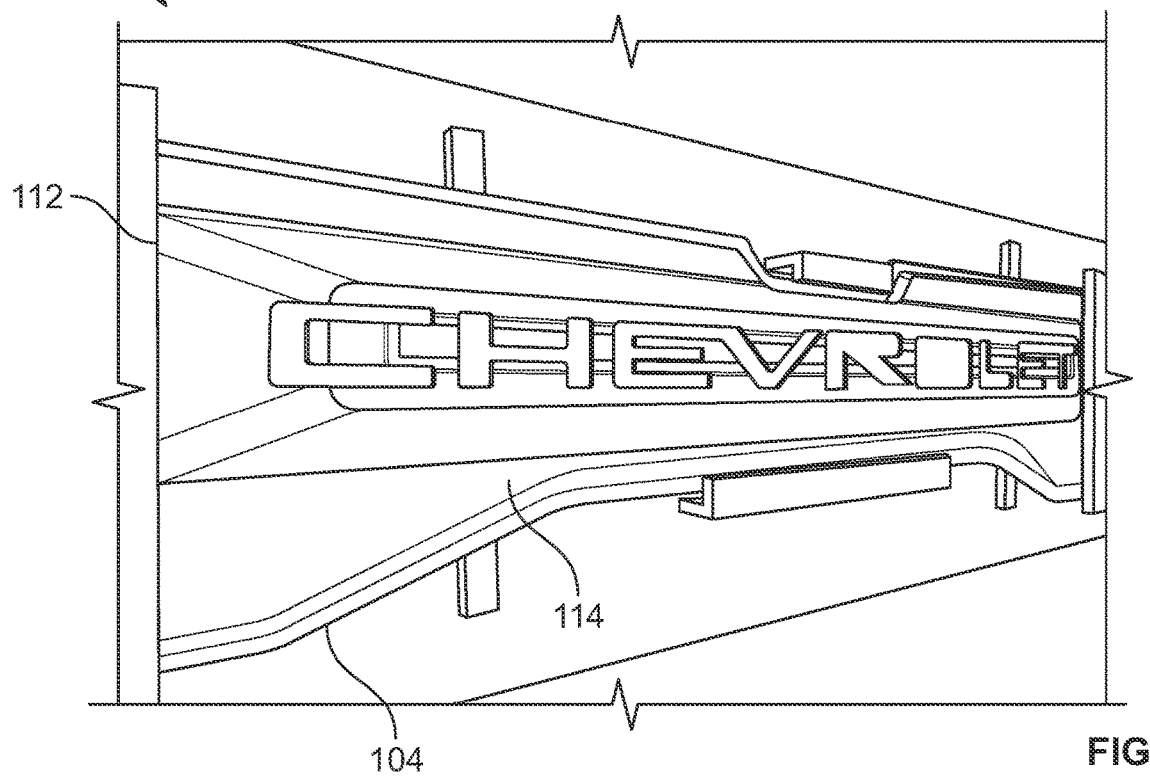
FIG. 6 is an illustration of the opaque body panel applique of claim 5, the illustration showing one or more display element cutouts.
Figure 7:
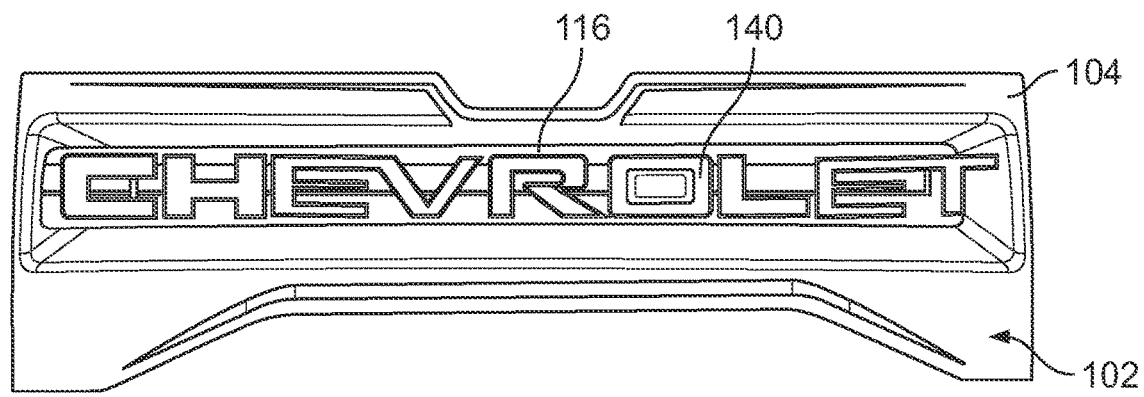
FIG. 7 is a front face of the lighted applique in one aspect of the current disclosure.

Referring now to FIGS. 5 and 6, the opaque body panel applique 102 may include one or more display element cutouts 112. Each of the display element cutouts 112 having a cutout profile 114. In one aspect of the disclosure it is contemplated that the cutout profiles 114 comprise letters. In another aspect, they may be designs or logos. In one aspect of the disclosure, the display element cutouts 112 are removed from a solid opaque body panel applique 102 (FIG. 5) using cutting or stamping techniques. In another aspect, they are formed directly into the opaque body panel applique 102 when it is produced. The cutout profiles 114 may have complex shapes as they follow the profile of the panel exterior surface 104. Referring now to FIGS. 7-15, the lighted applique 100 may include at least one non-opaque display element 116. It is contemplated that the at least one non-opaque display element 116 may take a variety of forms such as letters, logos, etc. One aspect of the disclosure contemplates the non-opaque display elements 116 to be semi-transparent such that light is diffused as it passes through them. The non-opaque display elements 116 may be molded, 3D printed, or manufactured in a variety of fashions. In one particular aspect it is contemplated that they are formed with a pattern 118 on their exterior to control the amount of diffusion of light passing through them such as diagonal lines, checkered patterns etc. The non-opaque display elements 116 have a display element outer surface 120, a panel engagement surface 122 defining an engagement surface profile 124 (see FIG. 10). The engagement surface profile 124 matches the profile of the panel exterior surface 104 around the display element cutout 112. This allows the non-opaque display elements 116 to be mounted in the display element cutouts 112 in areas of the panel exterior surface 104 are non-planar while maintaining a planar orientation of the display element outer surface 120. The display element cutouts 112 further include a display element rear extension 126 defining an exterior surface profile 128. The exterior surface profile 128 matches the respective cutout profile 114 such that the non-opaque display elements 116 are securely positioned within their respective display element cutouts 112 and the panel engagement surface 122 is flush with the panel exterior surface 104. The display element rear extension 126 is configured to extend past the panel interior surface 106 (see FIGS. 8 and 14). The non-opaque display elements 116 further includes a display element rear surface 130 that defines at least one lighting strip channel 132. In one particular aspect of the disclosure the at least one lighting strip channel 132 comprises an LED strip channel. In another, the at least one lighting strip channel 132 comprises a first lighting strip channel 134 and a second lighting strip channel 136 running parallel to each other (see FIGS. 9 and 12).

Figure 10:
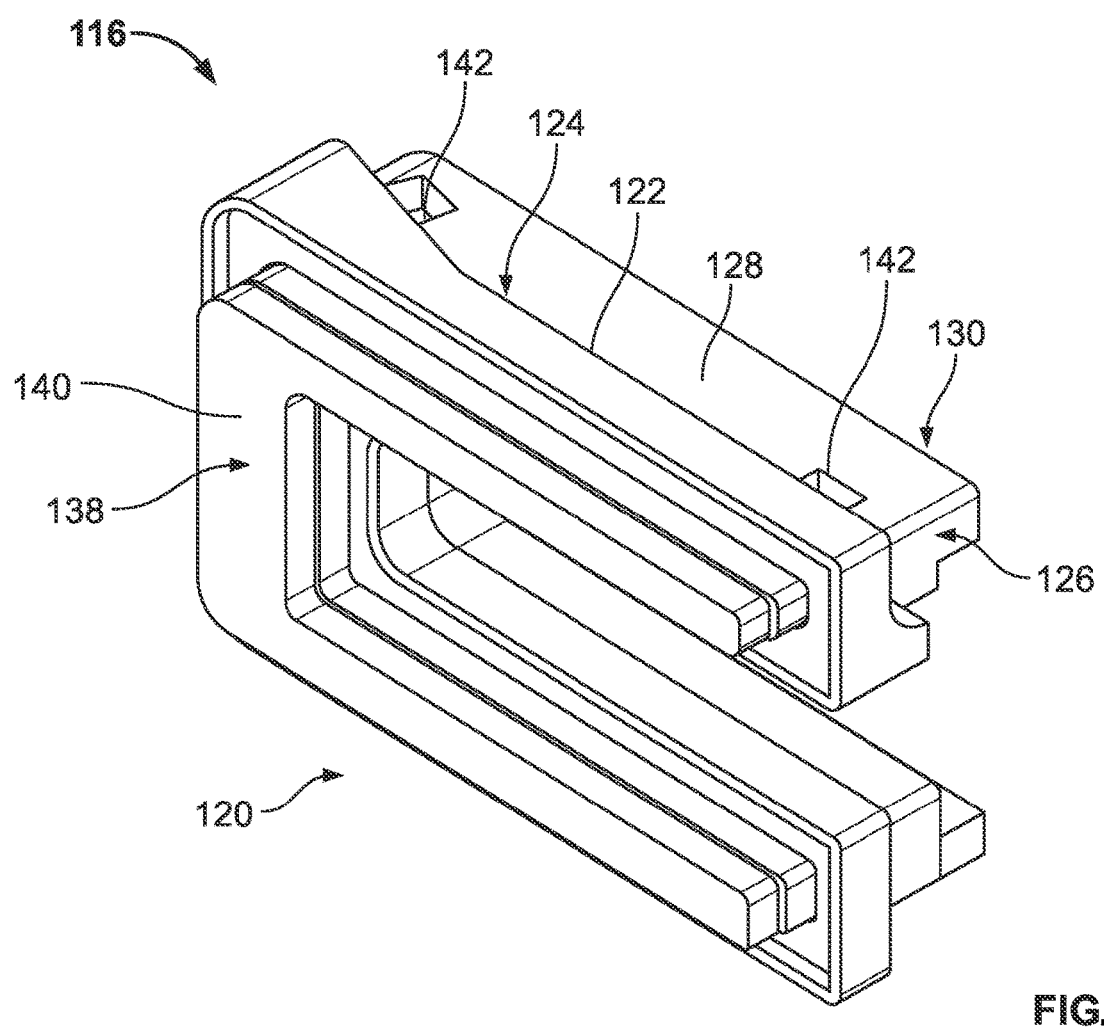
FIG. 10 is an isometric detail of a non-opaque display element for use in the lighted applique shown in FIGS. 7-9.
Figure 11:
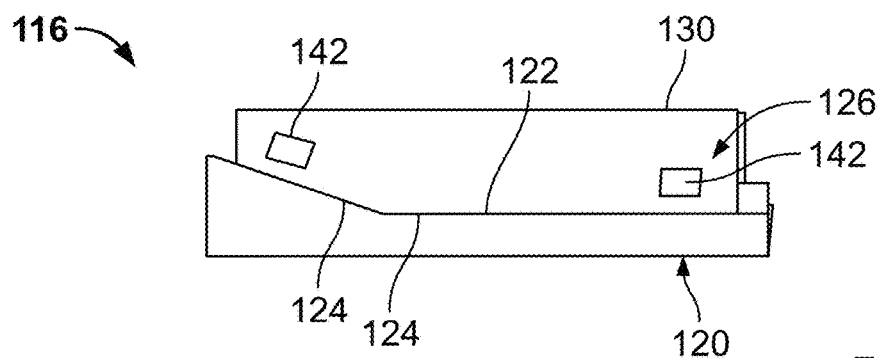
FIG. 11 is a top view detail of the non-opaque display element shown in FIG. 10.
Figure 12:
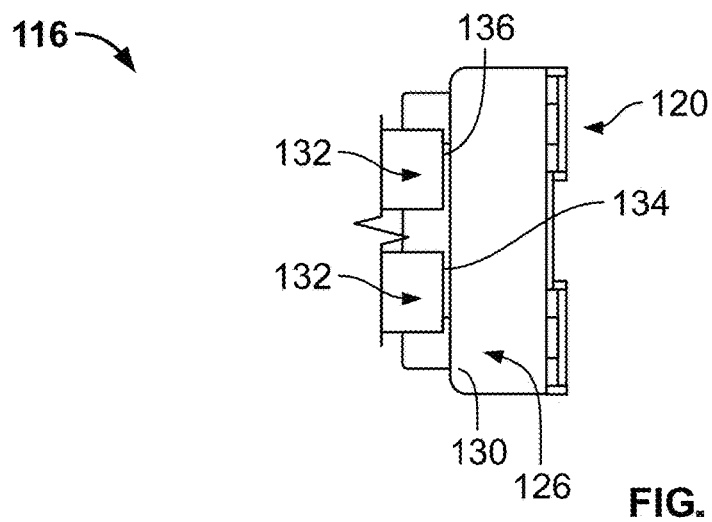
FIG. 12 is a side view detail of the non-opaque display element shown in FIG. 10.
Figure 13:
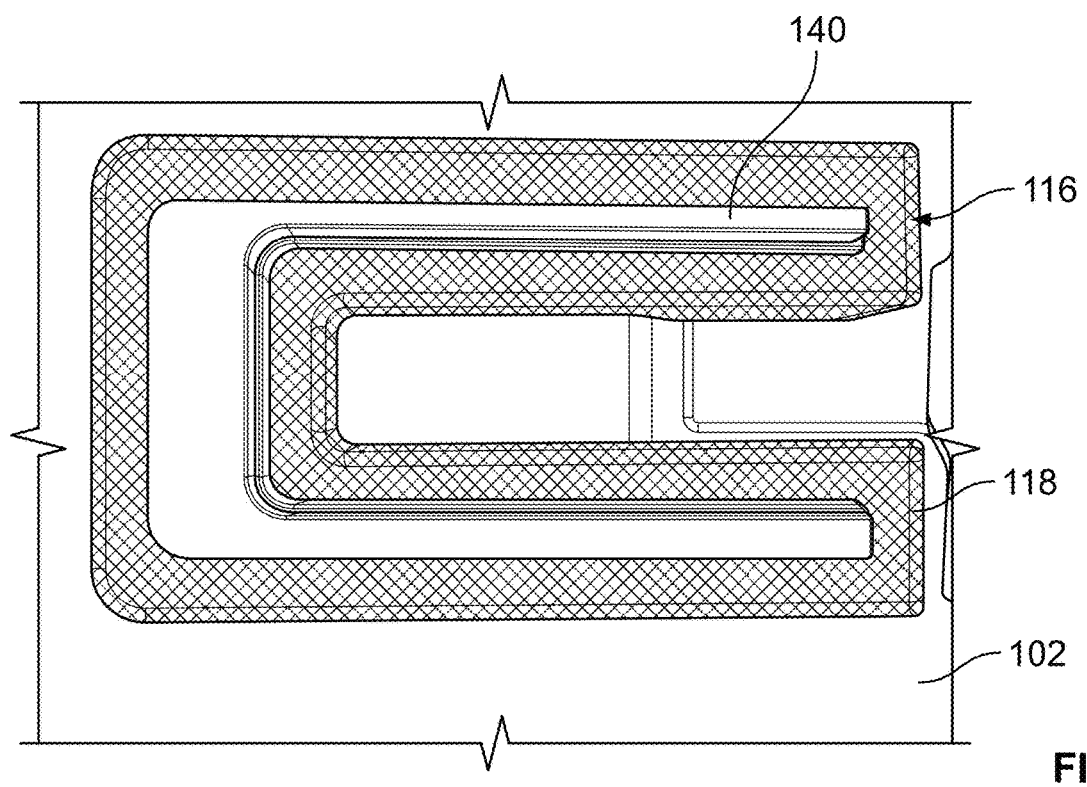
FIG. 13 is a top view of the non-opaque display element shown in FIG. 10.
Figure 14:
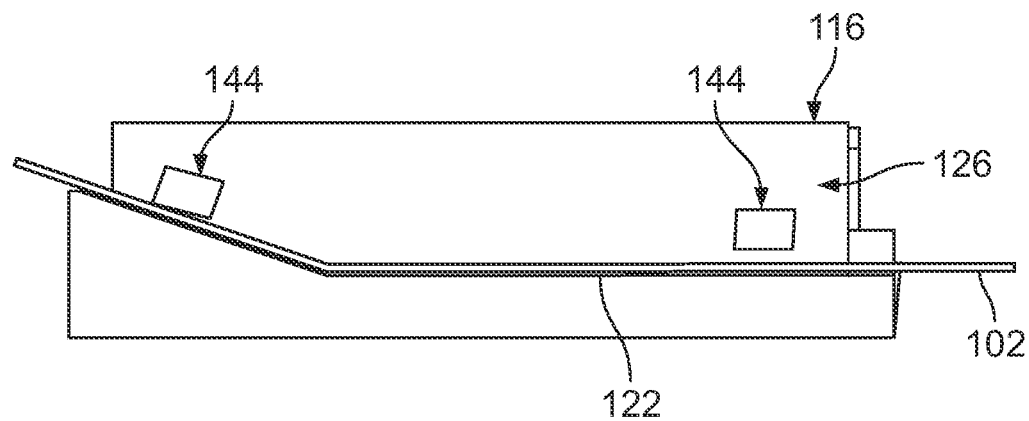
FIG. 14 is a top view of the non-opaque display element shown in FIG. 10, the non-opaque display element shown installed onto the opaque body panel applique.
Figure 15:
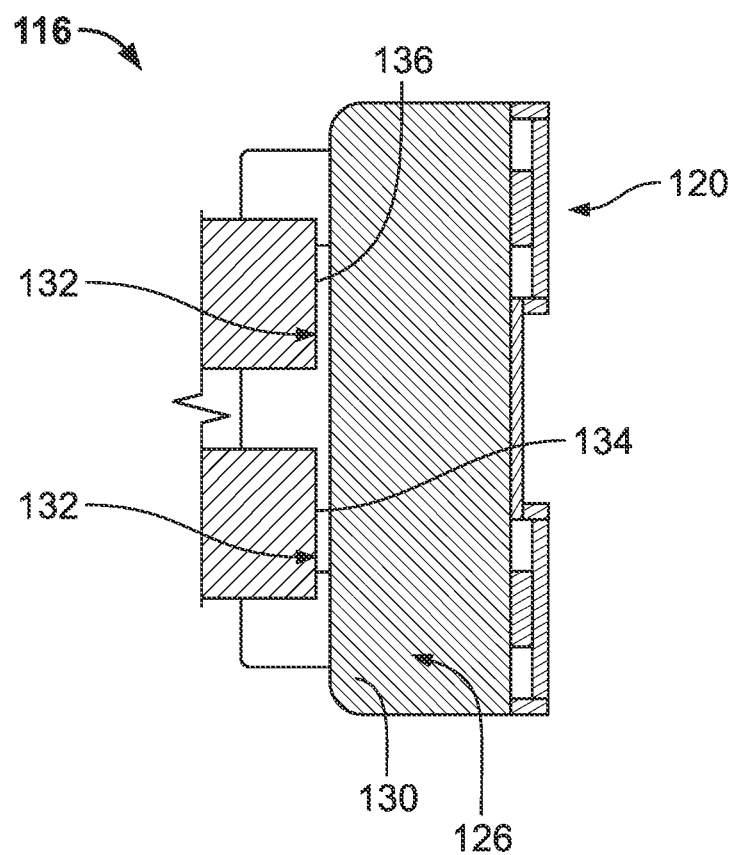
FIG. 15 is a cross-sectional view of the non-opaque display element shown in FIG. 10.

Referring now to FIGS. 10, in one aspect of the disclosure the non-opaque display elements 116 may include a recessed inner profile 138 formed on the display element outer surface 120. The recessed inner profile 138 may take any shape, but in one aspect of the disclosure it follows the shape of the non-opaque display elements 116. The non-opaque display elements 116 may further include an opaque display insert 140 mounted within the recessed inner profile 138. In this fashion, when the non-opaque display element 116 is mounted within its respective display element cutout 112 formed in the opaque body panel applique 102, the only place for light to pass through the non-opaque display element 116 is around their perimeter (see FIG. 7). The non-opaque display elements 116 may include one or more securing channels 142 formed in the display element rear extension 126. When the non-opaque display element 116 is positioned within its respective display element cutout 112, one or more display element securing pins 144 are placed within the securing channels 142. This wedges the non-opaque display elements 116 tightly and securely to the opaque body panel applique 102 (see FIGS. 8 and 14, 15). In other aspects of the disclosure alternate mounting methods are contemplated.

The lighted applique 100 further includes at least one lighting element 146 mounted behind the display element rear surface 130. In one particular aspect of the disclosure, the lighting element 146 may comprise at least one LED strip. In another aspect of the disclosure the lighting element 146 may comprise a strip of individually addressable light emitting diodes (LEDs). In still another aspect of the disclosure, the lighting element 146 may comprise a pair of LED strips 146 running parallel to teach other and mounted within the first LED strip channel 134 and the second LED strip channel 136. When a plurality of non-opaque display elements 116 are utilized in combination. The lighting strips are secured within the strip channels 134, 136 across the multiple elements. An electrical connection assembly 148 is in communication with the lighting/LED strip 146 to provide power and communication to the LED strip 146. The lighted applique 100 further may include an automotive taillight/towing lighting adapter 150 configured to connect the electrical connection assembly 148 to the automotive safety light system (as explained below). This allows the lighted applique 100 to receive signals from the automobile 10, 12 and use them to activate the LED strips 146. Thus braking, turn signals, hazards, etc. may all be reflected through the non-opaque display elements 116. In at least one aspect, the lighted applique 100 may further include a lighting/LED controller 152 that turns the signals from the automobile 10,12 into varied patterns in the individually accessible LED strips 146. For example, a right turn blinking signal could be translated into a miming pattern of LEDs from the center of the tailgate 20 to right side. Furthermore, it could allow customer customization of which patterns they prefer for which signals. An individually addressable LED strip 140 commonly utilized a ground channel, a power channel, and a data channel. The LED controller 152 takes the signals from the automobile 10,12 and translates them into both a voltage and data signal usable by the individually addressable LEDs 146. The electrical connection assembly 148 and the automotive taillight/towing lighting adapter 150 may be fished through a hole formed in the automotive body panel 20 and pulled to reach the nearest connection for the vehicle safety systems.

Figure 16:
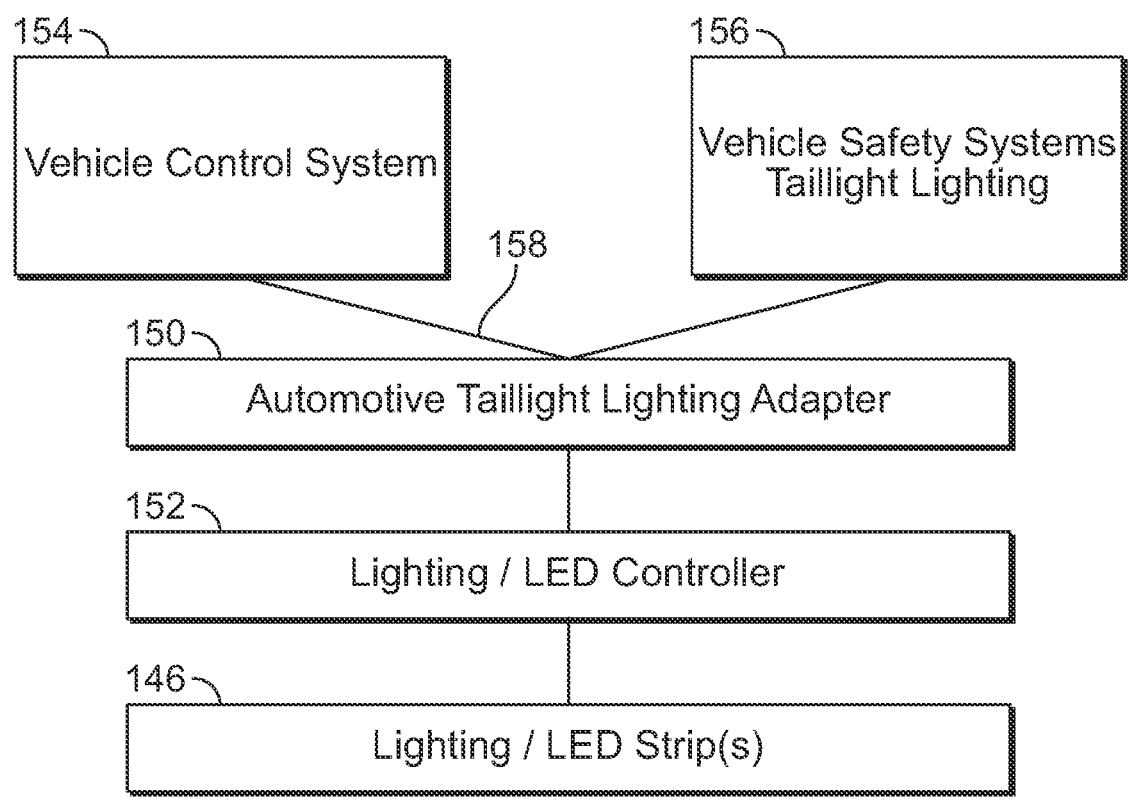
FIG. 16 is a chart showing integration of the lighted applique into the vehicle safety lighting tailgate system.

Referring now to FIG. 16 which discloses one aspect of the disclosure. FIG. 16 illustrates a control signal arrangement for the lighted applique 100. In a typical vehicle, the vehicle control system 154 generates a signal to send to the vehicle safety systems 156 and sends that through an electrical bus 158 to the vehicle safety systems 156. The present disclosure intercepts the signal by way of the automotive taillight lighting adapter 150 and sends it to the lighting/LED controller 152 while continuing to pass it on to the vehicle safety systems 156. The lighting/LED controller 152 takes that signal and translates it into a pattern signal for the LED lighting strips 146 and activates the LED lighting strips 146 with the respective pattern.

What is claimed is:

1. A lighted applique for mounting to an automotive body panel having an automotive body panel contour and in proximity to an automotive safety light system, the lighted applique comprising:
    an opaque body panel applique including a panel exterior surface and a panel interior surface, the panel interior surface having an interior surface outer perimeter configured to conform to the automotive body panel contour;
    one or more display element cutouts each having a cutout profile formed in the opaque body panel applique;
    at least one non-opaque display element having a display element outer surface, a panel engagement surface, a display element rear extension comprising an exterior surface profile matching the cutout profile, and a display element rear surface forming at least one LED strip channel, the at least one non-opaque display element mounted within the one or more display element cutouts such that the panel engagement surface is in contact with the panel exterior surface and the at least one display element rear extension extends past the panel interior surface;
    at least one LED strip mounted within the at least one LED strip channel;
    an electrical connection assembly in communication with the at least one LED strip; and
    an automotive taillight lighting adapter connected to the electrical connection assembly, the automotive taillight lighting adapter configured to receive signals sent from a vehicle control system to a vehicle safety system and send the signals to a LED controller configured to control the at least one LED strip.

2. The lighted applique of claim 1, wherein activation of the LED strip illuminates. non-opaque display element.

3. The lighted applique of claim 1, further comprising:
    one or more securing channels formed in the display element rear extension; and
    one or more display element securing pins;
    wherein the one or more display elements are positioned in the one or more securing channels when the one or more display elements are positioned in the one or more display element cutouts to secure the one or more display elements on the opaque body panel applique.

4. The lighted applique of claim 1, wherein the at least one LED channel comprises:
    a first LED strip channel; and
    a second LED strip channel parallel to the first LED strip channel.

5. The lighted applique of claim 1, wherein the at least one LED strip comprises a strip of Individually addressable LEDs.

6. The lighted applique of claim 1, wherein the at least one non-opaque display element comprises:
    a recessed inner profile; and
    an opaque display insert mounted within the recessed inner profile.

7. The lighted applique of claim 1, wherein the panel exterior surface is shaped to simulate the automotive body panel contour.

8. The lighted applique of claim 1, wherein the interior surface outer perimeter includes an adhesive or mounting clips to affix the interior surface outer perimeter to the automotive body panel.

9. A lighted applique for mounting to an automotive body panel having an automotive body panel contour and in proximity to an automotive safety light system, the lighted applique comprising:
    an opaque body panel applique including a panel exterior surface and a panel interior surface, the panel interior surface having an interior surface outer perimeter configured to conform to the automotive body panel contour;
    a plurality display element cutouts each having a cutout profile formed in the opaque body panel applique;
    a plurality of non-opaque display element having a display element outer surface, a panel engagement surface, a display element rear extension comprising an exterior surface profile matching the cutout profile, and a display element rear surface, the at least one non-opaque display element mounted within the one or more display element cutouts such that the panel engagement surface is in contact with the panel exterior surface and the at least one display element rear extension extends past the panel interior surface;
    at least one lighting element mounted behind the display element rear surface;

an electrical connection assembly in communication with the at least one lighting element, the electrical connection assembly configured to provide communication between the at least one lighting element and the automotive safety light system; and an automotive taillight lighting adapter connected to the electrical connection assembly, the automotive taillight lighting adapter configured to receive signals sent from a vehicle control system to a vehicle safety system and send the signals to a lighting controller configured to control the at least one lighting element.

10. The lighted applique of claim 9, further comprising:

at least one channel formed on one of the panel interior surface and the display element rear surface;

wherein the at least one lighting element is mounted within the at least one channel.

11. The lighting applique of claim 10, wherein the at least one channel comprises:

a plurality of channels formed on the display element rear surface.

12. The lighting applique of claim 9, wherein the at least one lighting element comprises:

a plurality of individually addressable lighting elements, wherein the lighting controller is in communication with the plurality of individual addressable lighting elements.

13. The lighting applique of claim 9, wherein the at least one non-opaque display element comprises:

a recessed inner profile; and an opaque display insert mounted within the recessed inner profile.

14. A method of modifying the appearance of an automotive body panel having an automotive body panel contour and in proximity to an automotive safety light system, the method comprising:

assembling a lighted applique for mounting to an automotive body panel, the assembling comprising:

forming an opaque body panel applique including a panel exterior surface and a panel interior surface, the panel interior surface having an interior surface outer perimeter configured to conform to the automotive body panel contour;

forming one or more display element cutouts each having a cutout profile in the opaque body panel applique;

inserting at least one non-opaque display element into the one or more display element cutouts, the at least one non-opaque display element having a display element outer surface, a panel engagement surface, a display element rear extension comprising an exterior surface profile matching the cutout profile, and a display element rear surface forming at least one LED strip channel, the at least one non-opaque display element inserted within the one or more display element cutouts such that the panel engagement surface is in contact with the panel exterior surface and the at least one display element rear extension extends past the panel interior surface;

attaching at least one LED strip mounted within the at least one LED strip channel;

mounting an electrical connection assembly in communication with the at least one LED strip; and connecting an automotive taillight lighting adapter to the electrical connection assembly, the automotive taillight lighting adapter configured to receive signals sent from a vehicle control system to a vehicle safety system and send the signals to a LED controller configured to control the at least one LED strip.

15. The method of claim 14, further comprising:

drilling at least one access hole in the automotive body panel;

routing the at least one electrical connection assembly through the at least one access hole; and connecting the at least one electrical connection assembly to the automotive safety light system.

16. The method of claim 14, further comprising:

inserting an opaque display insert mounted within a recessed inner profile formed in the at least one non-opaque display element.

17. The method of claim 14, further comprising:

forming the panel exterior surface in a shape to simulate the automotive body panel contour.

18. The method of claim 14, further comprising:

forming one or more securing channels in the display element rear extension; and inserting one or more display element securing pins into the one or more securing channels after inserting the least one non-opaque display element into the one or more display element cutouts to secure the at least one non-opaque display element within the one or more display element cutouts.

19. The method of claim 14, further comprising:

attaching a lighting controller in between the at least one LED strip and the electrical connection assembly.

* * * * *